(12) United States Patent
Ries

(10) Patent No.: US 6,522,236 B1
(45) Date of Patent: Feb. 18, 2003

(54) SUPERCONDUCTOR STRUCTURE WITH HIGH $T_C$ SUPERCONDUCTOR MATERIAL, PROCESS FOR PRODUCING THE STRUCTURE, AND CURRENT LIMITER DEVICE HAVING SUCH A STRUCTURE

(75) Inventor: Günter Ries, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/592,743

(22) Filed: Jun. 13, 2000

Related U.S. Application Data

(63) Continuation of application No. PCT/DE98/03596, filed on Dec. 7, 1998.

(30) Foreign Application Priority Data

Dec. 19, 1997 (DE) .......................................... 197 56 854

(51) Int. Cl.[7] .................................................. H01C 7/00
(52) U.S. Cl. .......................... 338/13; 338/325; 505/881
(58) Field of Search ........................ 338/325, 13, 292, 338/293, 300, 224; 505/881

(56) References Cited

U.S. PATENT DOCUMENTS

| 3,098,967 A | * | 7/1963 | Keck ............................ 323/94 |
| 3,296,459 A | * | 1/1967 | Frankel ...................... 307/88.5 |
| 3,363,211 A | * | 1/1968 | Lambe et al. ................. 338/32 |
| 3,936,677 A | * | 2/1976 | Fulton et al. ............... 307/306 |
| 4,961,066 A | * | 10/1990 | Bergsjo et al. ............ 338/32 S |
| 5,010,300 A | * | 4/1991 | Hed ............................ 335/216 |
| 5,140,300 A | * | 8/1992 | Ohno et al. ................. 338/325 |

FOREIGN PATENT DOCUMENTS

| DE | 4004908 A1 | 8/1991 |
| DE | 4107685 A1 | 9/1992 |
| DE | 4434819 C1 | 1/1996 |
| DE | 19520205 A1 | 12/1996 |
| EP | 0292959 A2 | 11/1988 |
| EP | 0523374 A1 | 1/1993 |

OTHER PUBLICATIONS

Japanese Patent Abstract No. 02281765 (Osami), dated Nov. 19, 1990.
Japanese Patent Abstract No. 05163005 (Tatsuya), dated Jun. 29, 1993.

* cited by examiner

*Primary Examiner*—Lincoln Donovan
*Assistant Examiner*—Kyung Lee
(74) *Attorney, Agent, or Firm*—Laurence A. Greenberg; Werner H. Stemer; Gregory L. Mayback

(57) ABSTRACT

The superconductor structure for conducting an electric current in a predetermined direction has a metallic support and one or more conductor tracks. The conductor tracks have at least one electrically insulating interlayer deposited on the support and a high $T_c$ superconductor layer deposited on the interlayer. Between its superconducting layer and the support, the conductor track has at least one connecting part, which extends in the current-conducting direction, for electrically connecting the superconducting layer and the support in parallel. The superconductor structure may be provided in particular for a current limiter device.

14 Claims, 4 Drawing Sheets

SUPERCONDUCTOR STRUCTURE WITH HIGH $T_C$ SUPERCONDUCTOR MATERIAL, PROCESS FOR PRODUCING THE STRUCTURE, AND CURRENT LIMITER DEVICE HAVING SUCH A STRUCTURE

CROSS-REFERENCE TO RELATED APPLICATION

This is a continuation of copending international application PCT/DE98/03596, filed Dec. 7, 1998, which designated the United States.

BACKGROUND OF THE INVENTION

FIELD OF THE INVENTION

The invention relates to a superconductor structure for conducting an electric current in a predetermined direction. The structure has at least the following parts: a support made from metallic material and a conductor track which is located on the support. The conductor track contains at least one interlayer which is deposited on the support and is made from electrically insulating material and at least one superconducting layer which is deposited on the interlayer and is made from a high-$T_c$ superconductor material. The invention furthermore relates to a process for producing a corresponding superconductor structure. Such a structure and a corresponding production process is described in U.S. Pat. No. 4,921,833 (European published patent application EP 0 292 959. The invention furthermore relates to a current limiter device having such a superconductor structure.

Superconducting metal oxide compounds with high critical temperatures $T_c$ of over 77 K are known and are therefore also referred to as high-$T_c$ superconductor materials or HTS materials. The materials are particularly advantageous because the cooling in liquid nitrogen ($LN_2$). Such metal oxide compounds include in particular cuprates based on special material systems, such as for example of the types Y—Ba—Cu—O or Bi—Sr—Ca—Cu—O, in which the Bi component may be partially substituted by Pb. Within individual material systems there may be a plurality of superconducting high $T_c$ phases which differ through the number of copper-oxygen lattice planes or layers within the crystalline unit cell and have different critical temperatures $T_c$.

Attempts are made to deposit these known HTS materials on different substrates for various applications. It is thereby a general requirement that the superconductor material with the maximum possible phase purity is sought. For example, in particular metal substrates are provided for conductor applications (see, example, the above-noted U.S. Pat. No. 4,921,833 and European publication EP 0 292 959).

In a corresponding superconductor structure for conductor applications, the HTS material is generally not deposited directly on a metal support strip serving as a substrate; rather, the support strip is first covered with a thin interlayer, which is also known as a buffer layer. The interlayer, with a thickness of the order of magnitude of about 1 μm, is intended to prevent metal atoms from the substrate, which could impair the superconducting properties, from diffusing into the HTS material. At the same time, this interlayer can be used to smooth the surface and improve the adhesion of the HTS material. Appropriate interlayers generally comprise oxides of metals such as zirconium, cerium, yttrium, aluminum, strontium or magnesium and are therefore electrically insulating. In a discrete current-carrying conductor track, such as for example a strip conductor, this results in problems as soon as the superconductor changes to the normally conductive state at least in partial regions (known as quenching). This means that in sections the superconductor becomes resistive and thus adopts a resistance R, for example as a result of being heated beyond the critical temperature $T_c$ (so-called hotspots). The current I which is being conducted in the superconductor then continues to flow through the superconductor material, the voltage drop U=R·I forming only over the region which has become resistive. By contrast, in a metal substrate which is in strip form and supports the superconducting conductor track, the voltage U which is applied at the ends drops uniformly over the entire length of the conductor. Under certain circumstances, this may result in high voltage differences in the conductor track across the interlayer. Owing to the small thickness of the layer, this inevitably leads to electrical sparkovers and thus to the interlayer, and possibly the superconductor, being destroyed at certain points. A similar problem arises inter alia when superconductors of corresponding structure are used in magnet windings or in cables. This problem also arises in particular if resistive current limiter devices are produced using corresponding conductor strips. This is because in such a device the transition from the superconducting state to the normally conducting state is utilized to limit current in the event of a short circuit. In this case, it is impossible to provide the interlayer with a sufficient dielectric strength to withstand the operating voltages in the kV range which are customary for such devices.

In view of this problem, in a prior current limiter device (see, for example, commonly assigned German patent application DE 195 20 205 A), the HTS material is applied to electrically insulating, for example ceramic, substrate plates. It is also possible for an additional metal layer made from a material with a good electrical conductivity, such as Au or Ag, to be deposited directly on the HTS material as a shunt against burning through at the so-called hotspots. As a result, the HTS material is in electrically conductive surface-to-surface contact with the metal layer (see, for example, German patent DE 44 34 819 C). In that case, the above-mentioned voltage problem does not arise.

SUMMARY OF THE INVENTION

It is accordingly an object of the invention to provide a superconductor structure with high-$T_c$ material, an associated production method and a current limiter device, which overcomes the above-mentioned disadvantages of the heretofore-known devices and methods of this general type and which has a reduced risk of undesirable voltage differences in the conductor track across the electrically insulating interlayer using a metal support.

With the foregoing and other objects in view there is provided, in accordance with the invention, an claim 1. superconductor structure for conducting an electric current in a predetermined direction, comprising:

a support of metallic material;

a conductor track on the support, the conductor track containing at least one interlayer of electrically insulating material deposited on the support and at least one superconducting layer of high-$T_c$ superconductor material deposited on the interlayer;

at least one electrically conductive connecting part associated with the conductor track and extending in a current flow direction of the conductor track, between the superconducting layer of the conductor track and the support, the connecting part connecting the superconducting layer electrically in parallel with the support.

The advantages associated with this layout of the novel superconductor structure are that the metal support and the superconducting layer of the conductor track, as seen in the current-conducting direction, are brought into electrical contact with one another at least over a large part of the length of the structure, so that current can pass between them at least in that area. Consequently, sparkover through the interlayer is advantageously suppressed in the conductor track at the connecting regions.

In accordance with an added feature of the invention, the at least one connecting part is a strip-like metal layer extending laterally from the superconducting layer to an edge area of the support.

In accordance with an additional feature of the invention, the superconducting layer has an edge strip that laterally overlaps the interlayer. The edge strip forms the at least one connecting part and rests on a corresponding edge area of the support.

In accordance with another feature of the invention, the interlayer is formed with lateral recesses, where the superconducting layer rests on the support.

In accordance with a further feature of the invention, the support is made from Cu, Al, Ag, their alloys, or steel. In particularly, the support may be made from a NiMo alloy.

In accordance with again an added feature of the invention, the at least one interlayer is formed with a texture that is matched to the crystalline dimensions of the superconductor material.

In accordance with again an additional feature of the invention, the at least one interlayer is made from biaxially textured, yttrium-stabilized $ZrO_2$ or $CeO_2$.

In accordance with again another feature of the invention, the conductor track is a plurality of discrete conductor tracks and the support is a common support for the plurality of conductor tracks.

With the above and other objects in view there is provided, in accordance with the invention, a method for producing the above-outlined superconductor structure. In a specific feature, the at least one connecting part between the superconducting layer and the support is formed by avoiding a deposition of the interlayer in the at least one connecting region or removing the interlayer prior to the deposition of the superconducting layer.

In other words, the at least one electrically conductive connecting part between the superconducting layer and the support may be formed by avoiding, in the corresponding at least one connecting region, a deposition of the interlayer or the interlayer is removed prior to the deposition of the superconducting layer. Alternatively, it is also possible for at least one metal layer part which extends over the corresponding at least one connecting region to be deposited.

Moreover, the superconductor structure can also advantageously be produced by providing simultaneous thermal vapor deposition of the individual components of the superconductor material while oxygen is being supplied, or a laser ablation process, or a sputtering process, or a chemical vapor deposition process, in particular with organometal components of the superconductor material, or a screen-printing process as the deposition process for the superconductor material. The abovementioned deposition process can produce superconducting layers with a high critical current density on the interlayer.

Furthermore, it is advantageous if an ion beam assisted deposition (IBAD) process is provided for deposition of the interlayer material. This process can be used in particular to produce biaxially textured crystal structures of known interlayer materials. The superconductor material then advantageously also grows on in biaxially textured form, so that high critical current densities can be achieved by the absence of current-limiting grain boundaries.

Particularly advantageously, the superconductor structure according to the invention may be for the purpose of forming a current limiter device, because the use of a metal support for the superconductor material ensures rapid dissipation of heat to the cryogenic medium required and thus ensures a correspondingly rapid switching sequence.

In accordance with yet an added feature of the invention, a plurality of electrically interconnected modular current limiter elements are provided, where each has the above-outlined superconductor structure.

In accordance with yet an additional feature of the invention, each current limiter element has a winding comprising a bifilar-wound conductor strip having the superconductor structure.

In accordance with a concomitant feature of the invention, there are provided insulating strips between the strip conductor windings. The insulating strips are disposed to enable access for a coolant between adjacent conductor strip layers.

Other features which are considered as characteristic for the invention are set forth in the appended claims.

Although the invention is illustrated and described herein as embodied in a superconductor structure with high $T_c$ superconductor material, process for producing the structure, and current limiter device having such a structure, it is nevertheless not intended to be limited to the details shown, since various modifications and structural changes may be made therein without departing from the spirit of the invention and within the scope and range of equivalents of the claims.

The structure and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
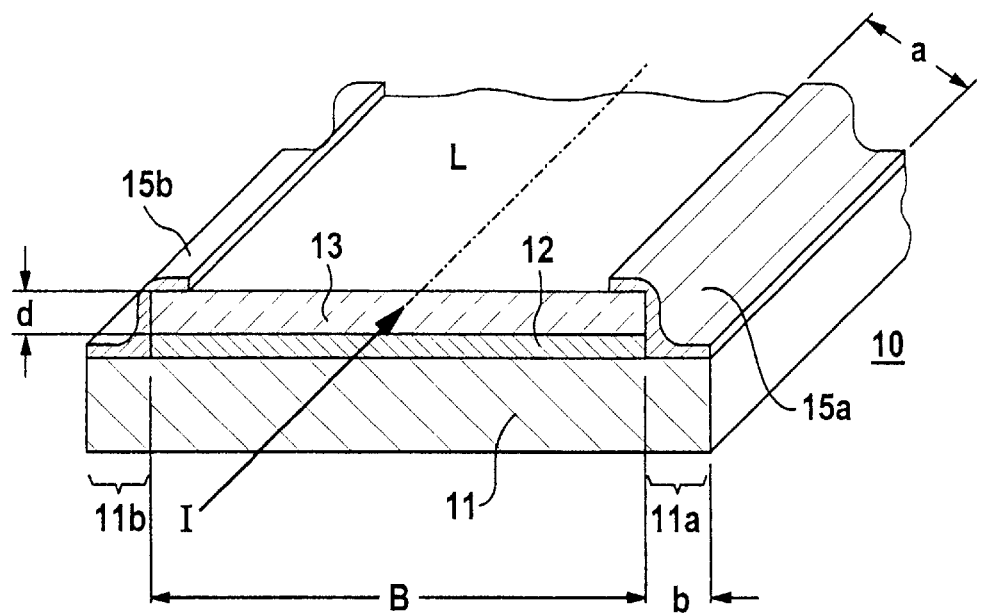
FIG. 1 is a perspective view of a theoretically possible design of the superconductor structure.

Designs which are known per se (cf. above-mentioned patent publications U.S. Pat. No. 4,921,833 and EP 0 292 959 A) as provided in particular also for superconducting current limiter devices (cf. DE 195 20 205 A or EP 0 523 374 A, which have also been mentioned above), form the basis for the design of the superconductor structure according to the invention. The superconductor structure according to the invention therefore at least comprises: a support, which can also be referred to as a substrate, and at least one conductor track located thereon. This conductor track comprises at least one interlayer which is deposited on the support and can also be referred to as a buffer layer, and a layer of an HTS material which is applied to this interlayer. The two layers are structured so as to form the conductor track. A plate or a strip or other structure made from a metallic material with any desired thickness and the surface dimensions which are required for the particular application is used for the support. Suitable metallic materials for this purpose are all elemental metals or alloys of these metals which are known as supports for HTS materials. By way of example, Cu, Al or Ag or their alloys with one of the elements as the principal component or steels, as well as special NiMo alloys, in particular known by the trade name "Hastelloy", are suitable.

To enable textured, in particular epitaxial growth of the HTS material, which is required for a high critical current density $J_c$ of the HTS material, to be achieved, the at least one interlayer should consist of a material which ensures such growth. Therefore, an interlayer with a texture which is matched to the crystalline dimension of the HTS material is particularly suitable. In all cases, the interlayer material should be electrically insulating. Biaxially textured, yttrium-stabilized zirconium oxide (for short: "YSZ") is advantageous. In addition, other known buffer layer materials, such as for example $CeO_2$, $YSZ+CeO_2$ (as a double layer), $Pr_6O_{11}$, MgO, YSZ+tin-doped $In_2O_3$ (as a double layer), $SrTiO_3$ or $La_{1-x}Ca_xMnO_3$ are also suitable. One or more of these materials is deposited on the surface of the support in a manner known per se. A so-called IBAD process (Ion Beam Assisted Deposition process) may advantageously be provided for this purpose. Naturally, other processes are also suitable, such as for example sputtering or laser ablation at a predetermined angle. The interlayer material is in most cases deposited at elevated temperatures on the support. The layer thickness of the textured interlayer produced in this way is generally between 0.1 and 2 μm.

Then, the HTS material is applied to the interlayer using known deposition processes and while the support is being heated, with a thickness of generally up to a few micrometers. The most customary of the appropriate processes of the PVD (Physical Vapor Deposition) technique are laser ablation using a pulsed laser, magnetron sputtering or preferably thermal vapor codeposition (=simultaneous vapor deposition of the components of the HTS material while oxygen is being supplied). CVD (Chemical Vapor Deposition) processes, in particular using organometal starting materials, are also suitable. Alternatively, a screen-printing process which is known per se may also be provided.

Suitable HTS materials are all known metal oxide high $T_c$ superconductor materials which in particular allow an $LN_2$ cooling technique to be used. Examples of appropriate materials are $YBa_2Cu_3O_{7-x}$ or $RBa_2Cu_3O_{7-x}$ (where R=rare earth element), $HgBa_2CaCu_2O_{6+x}$, $HgBa_2Ca_2Cu_3O_{8+x}$, $Bi_2Sr_2CaCu_2O_{8+}$or $(Bi,Pb)_2Sr_2Ca_2Cu_3O_{10+x}$. The HTS layer may be covered with at least one further layer, such as for example a protective layer or a layer serving as a shunt resistor.

The interlayer and the HTS layer located thereon are structured to form at least one conductor track. It is also possible to provide layer tracks which have been deposited discretely in an appropriate manner.

Referring now to the figures of the drawing in detail and first, particularly, to FIG. 1 thereof, there is seen a corresponding superconductor structure according to the invention comprising strip-like support 11, an interlayer 12, and an HTS layer 13. The interlayer 12 and the HTS layer 13 form a conductor track L in strip form. According to the invention, at least one electrically conductive connecting part, which extends in the direction in which an electric current I is conducted, indicated by an arrow, is to be present between the HTS layer 13 and the support 11 of the conductor track L. This means that, as seen in this direction, the superconducting layer is to be connected in parallel with the support by means of the at least one connecting part over the entire length of the structure, i.e. without interruption. However, it is also possible for regularly distributed interruptions, which are short as seen in this direction, to be provided in the connection between these parts without the desired parallel connection being significantly impaired. According to the exemplary embodiment illustrated in FIG. 1, two connecting parts in the form of lateral, strip-like layers 15a and 15b are formed from a metal with a good electrical conductivity, such as Ag, Au or Cu. To produce these strip-like metal layers 15a and 15b, in at least one of the two lateral, strip-like edge areas 11a and 11b of the strip-like support 11, the buffer layer 12 is either not applied at all during deposition, for example by using a shadow mask, or is removed by mechanical or chemical processes following this, such as grinding, etching, vaporization using a laser beam. The width b of these edge areas 11a and 11b of the support, which are now bare, should advantageously be in each case at least five times a thickness d of the HTS layer 13, but preferably significantly more, up to one hundred times the thickness d. The contact between the HTS layer 13 and the support 11 is then brought about through the application of the strip-like metal layers 15a and 15b, which extend laterally beyond the interlayer 12 and cover the corresponding edge area of the superconductor layer and the bare edge areas 11a and 11b of the support. The HTS layer may, like the interlayer, have been removed in the edge areas 11a and 11b or alternatively may extend beyond these areas. In general, the lateral extent a of the metal layers 15a and 15b is short, preferably 1/10 to 1/100, compared to the width B of the strip-like superconductor layer 13 or the interlayer 12 located beneath it. The maximum thickness of these metal layers is generally at most equal to the thickness d of the HTS layer 13.

Figure 2:
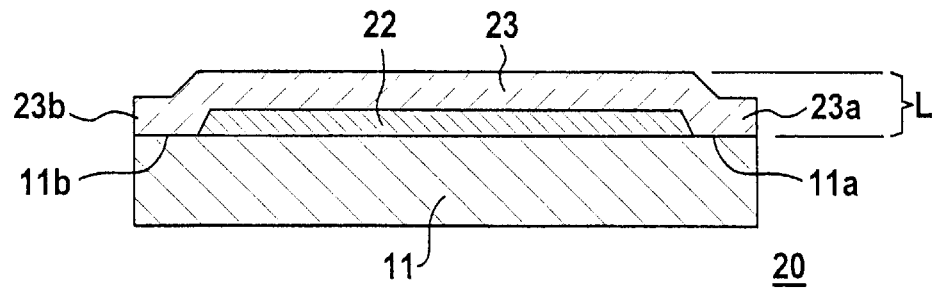
FIG. 2 is a sectional view of another theoretically possible design of the superconductor structure.

In the superconductor structure 20 according to the invention which is shown in FIG. 2, the HTS layer 23 of its conductor track L extends laterally beyond the narrower interlayer 22, as far as the entire width of the support 11. Consequently, in this embodiment no special metal strips are required to provide the contact, but rather the HTS layer is in direct electrical contact with the support in the edge areas 11a and 11b of the support 11, since it laterally overlaps the interlayer 22. In this case, in the area of the edge of the interlayer 22 and on the edge areas 11a and 11b, the superconducting characteristics, such as the critical current density $J_c$ and/or the critical temperature $T_c$, may be reduced in the corresponding edge strips 23a and 23b of the HTS layer 23. If appropriate, the material of the layer 13 may even be normally conductive in these areas.

Figure 3:
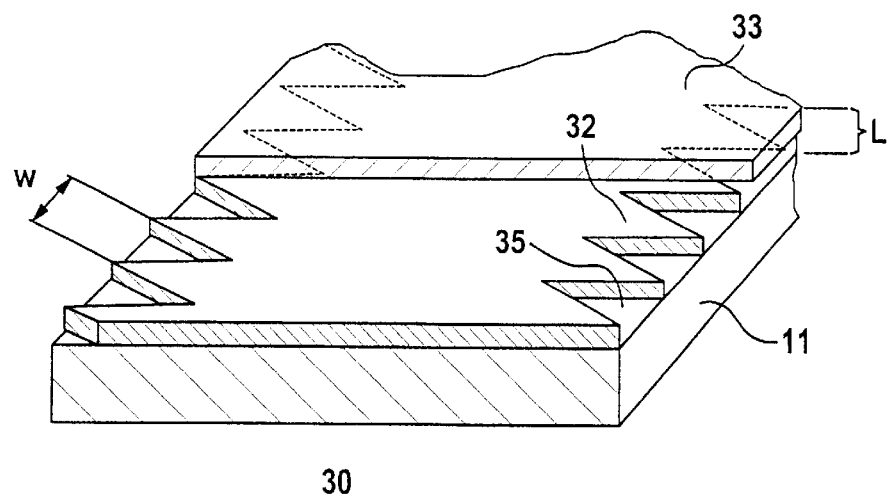
FIG. 3 is a perspective view of a specific embodiment of the superconductor structure according to the invention.

As an alternative to the embodiments of a superconductor structure 10 and 20 according to the invention illustrated in FIGS. 1 and 2, respectively, in which the electrically conductive connection, as seen in the current-conducting direction, between the HTS layer of a conductor track L and the metallic support extends over practically the entire axial length of the structure, it is also possible for these two parts of the structure to be in contact with one another but with regular interruptions in this direction. FIG. 3 shows a corresponding superconductor structure 30. There, as in the embodiment shown in FIG. 2, the contact is brought about by the HTS layer 33 itself. For this purpose, in an interlayer 32 recesses 35, which are, for example, triangular and in which the HTS layer 33 rests directly on the support 11, are provided at regular intervals one behind the other in the current-conducting direction. In this case, therefore, the interlayer 32 has, as it were, a toothed lateral contour, the mean tooth width w advantageously being at least 5 times the thickness d of the HTS layer 33. In this way, it is advantageously possible to extend the length of the over-heating zone between the superconducting material of the conductor track and the metallic support, the transfer resistance being correspondingly reduced.

Figure 4:
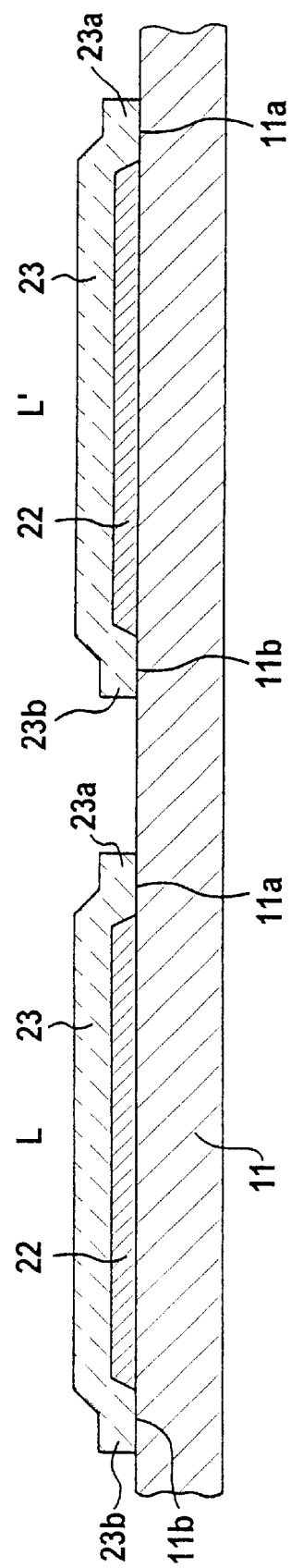
FIG. 4 is a sectional view of a two-element modular conductor with two elements placed next to one another on a common substrate.

In the exemplary embodiments of a superconductor structure according to the invention which are shown in FIGS. 1 to 3, it has been assumed that a single strip-like conductor track L is formed on a support 11 and the support additionally has a shape which is matched to the strip shape of the conductor track. Of course, supports whose width is relatively great are also suitable for a superconductor structure according to the invention. If the support is of sufficient size, it is then also possible for a plurality of conductor tracks to be arranged thereon. FIG. 4 shows, in an illustration corresponding to FIG. 2, such a superconductor structure, in which two parallel conductor tracks L and L', each having a layer structure as shown in FIG. 2, are situated on a common support 11.

A cross section corresponding to FIG. 4 would also result if a single conductor track of looped or U-shaped or meandering form were to be formed on the support.

Figure 5:
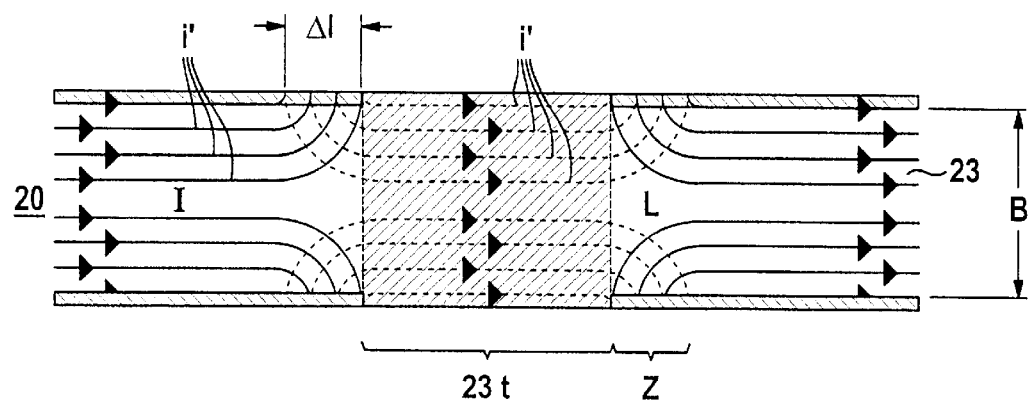
FIG. 5 is a plan view of a current limiter element produced from the superconductor structure with quenched current conductance.

Referring now to FIG. 5, there is shown a plan view of a strip-like superconductor structure in accordance with FIG. 1 or FIG. 2. By way of example, the structure 20 of FIG. 2 with the conductor track L is assumed. A partial segment 23$t$, which is shaded, of the HTS layer 23 of this conductor track is assumed to have become normally conductive (resistive). The flow of the current I which is then established is indicated by current lines, the current lines in the HTS layer 23 being denoted by i and illustrated by solid lines, while the current lines i' extending through the support are shown by dashed lines. If the resistance of the resistive partial segment 23$t$ is high compared to the parallel section of the support strip, most of the current I is diverted, parallel to the resistive partial segment 23$t$, via the electrical connection provided by the edge strips 23$a$ and 23$b$ at the edges, into the metallic support. An analysis of the two-dimensional current distribution in a strip-like superconductor structure shows that a cross-over zone Z approximately has an axial extent $\Delta l = B/\pi$, where B is the width of the HTS layer. In this way, a voltage difference across the insulating interlayer 22 of the conductor track L is reduced to a tolerable level in the region of a few volts. The metallic support additionally acts as a shunt resistor for the superconductor and, for example in a current limiter device, advantageously obviates the need for additional application of a low-resistance film made from material with a good conductivity, such as Ag or Au, to the surface of the HTS layer in order, if appropriate, to avoid unacceptable heating of the superconductor section in a hotspot which has become prematurely normally conductive.

Particularly advantageously, the superconductor structure according to the invention may be provided for a resistive current limiter device. For this purpose, by way of example a large-surface-area, plate-like structure or, as assumed below, a strip conductor type in accordance with one of the embodiments shown in FIGS. 1 and 3 forms the basis, in which a $YBa_2Cu_3O_{7-x}$ layer with a thickness of approximately 0.3 to 10 $\mu$m is applied to a preferably textured interlayer (buffer layer) of its conductor track L. The corresponding strip conductor then carries the current without resistance until the critical current $J_c$ is reached and, after it has become normally conductive (quenched) as a result of $J_c$ being exceeded, has a sufficiently high resistance to effectively limit a fault current in the event of a short circuit. The metal strip of the support at the same time acts as a shunt for the superconductor layer and limits the temperature increase in "hotspots" which have prematurely become normally conductive.

To keep the length of the strip conductor as short as possible, its support should be as thin as possible, in particular should be between 0.03 and 0.1 mm thick, and should consist of a metal with a high specific electrical resistance, such as of Hastelloy in particular.

Figure 6:
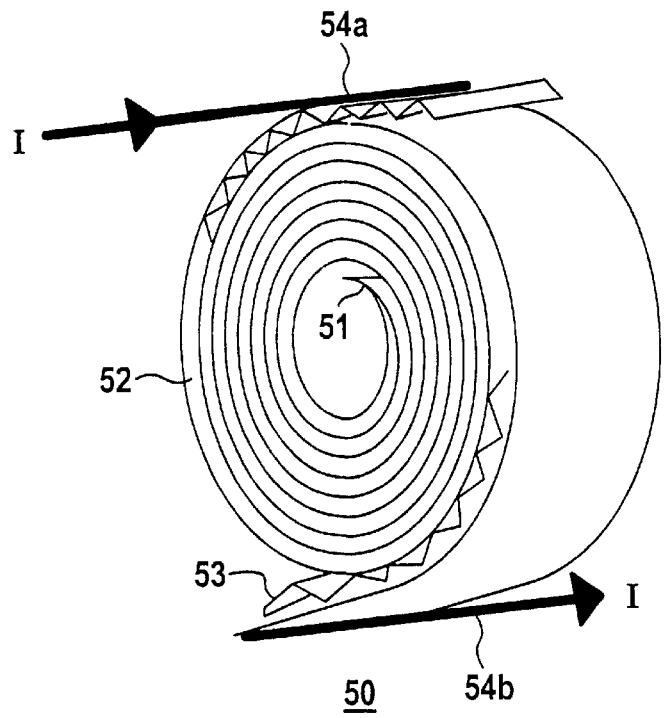
FIG. 6 is a perspective view of a current limiter device formed of a two-conductor coil.

Advantageously, in accordance with the illustration shown in FIG. 6, it is possible to form a low-inductance, modular limiter element 50 by parallel winding of strip conductors 20 and 20', which are electrically connected to one another at a common end 51, to form a bifilar disc winding 52. Insulating strips 53 for electrical insulation are inserted between adjacent strip layers of the winding 52, which insulating strips, for example by means of a corrugated or ribbed structure, at the same time make it easier for a coolant to gain access to the strip conductors for the purpose of rapid recooling after a switching operation. The figure also shows connection conductors 54$a$ and 54$b$ for the electrical connection of the strip conductor winding 52 or for supplying and discharging an electric current I.

Figure 7:
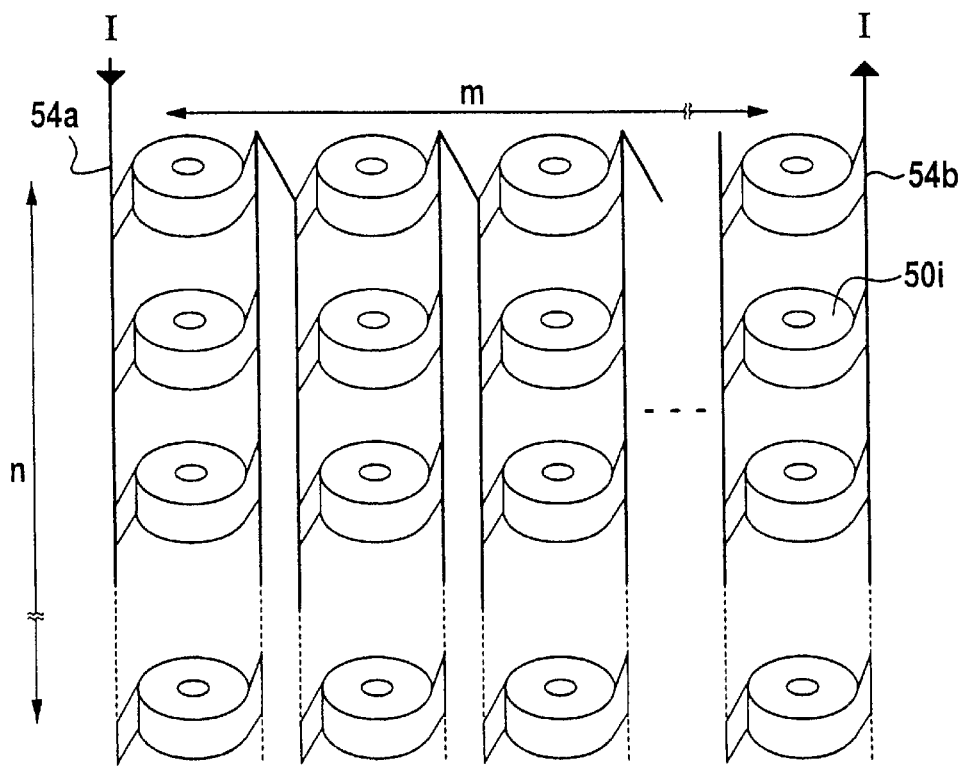
FIG. 7 is a diagrammatic view of a current limiter device with a plurality of individual devices of FIG. 6 arranged and connected in a parallel and serial array.

A plurality of such modular current limiter elements 50$i$ (where i=1 ... n·m) can be used to construct a current limiter device which is shown in FIG. 7 and is denoted by 60. By means of an n-fold parallel connection of a plurality of such elements with rated current I and rated voltage U, it is then possible to form current limiter devices for specific rated currents n·I, and by an m-fold series connection for rated voltages m·U.

A current limiter device 60 in accordance with FIG. 7 forms the basis for the data from a specific exemplary embodiment which are compiled below in the following table:

TABLE

| | | |
|---|---|---|
| 1. | Strip conductor for $I_c$ = 400 A | |
| | Thickness × width support strip (11) | 50 $\mu$m × 2 cm Hastelloy |
| | Biaxially textured interlayer (22) | 1 $\mu$m Y-stabilized $ZrO_2$ or $CeO_2$ |
| | Width (b) of bare edge areas (11a, 11b) on both sides | 0.02–0.2 mm |
| | Thickness (d) $YBa_2Cu_3O_{7-x}$ superconductor layer (23) | 2 $\mu$m |
| | Critical current density in the superconductor | $10^6$ A/cm$^2$ |
| | Optional: Ag layer (15a, 15b) thickness × width in the edge area | 1 $\mu$m × 0.1–0.3 mm |
| 2. | Modular current limiter element (50I) | |
| | 2 strips (20, 20') according to 1.), length | 2 × 7.5 m bifilar winding |
| | Layer insulation provided by insulating strip (53) | Plastic film 25 $\mu$m, corrugated |
| | External diameter strip | 10–20 cm |

TABLE-continued winding (52)
3. Current limiter device (60i) for 2000 $A_{rms}$, 15 kV

| | |
|---|---|
| Number of elements (50$_i$) in accordance with 2.) | 49 (n = 7 parallel × m = 7 in series) |
| Total length HTS strip (20, 20') in accordance with 1.) | L = 735 m |

In the above exemplary embodiments, the assumption was a parallel connection between the superconducting layer of a conductor track and the support, in each case at the edge of the superconducting layer. However, this is not necessarily the case. For example, it is also possible for recesses or trenches or holes, which extend in the current-conducting direction and at the edges of which the parallel connection according to the invention is made, to be formed into the superconducting layer. By way of example, recesses of this nature may extend in the center of a strip-like superconducting layer. In this case, however, it must in all cases be ensured that, according to the invention, each conductor track only has its assigned connecting parts in accordance with FIGS. 1 to 3.

I claim:

1. A superconductor structure for conducting an electric current in a predetermined direction, comprising:
   a support of normally conductive non-superconductive metallic material, said support also acting as a shunt resistor;
   a conductor track on said support, said conductor track containing at least one interlayer of electrically insulating material deposited on said support and at least one superconducting layer of high-$T_c$ superconductor material deposited on said interlayer;
   at least one electrically conductive connecting part extending in a current flow direction of said conductor track and connecting said superconducting layer electrically in parallel with said support.

2. The structure according to claim 1, wherein said at least one connecting part is a strip-like metal layer extending laterally from said superconducting layer to an edge area of said support.

3. The structure according to claim 1, wherein said superconducting layer has an edge strip disposed to laterally overlap said interlayer, said edge strip forming said at least one connecting part and resting on a corresponding edge area of said support.

4. The structure according to claim 3, wherein said interlayer is formed with lateral recesses wherein said superconducting layer rests on said support.

5. The structure according to claim 1, wherein said support is made from a material selected from the group consisting of Cu, Al, Ag, alloys thereof, and steel.

6. The structure according to claim 1, wherein said support is made from a NiMo alloy.

7. The structure according to claim 1, wherein said superconductor material has defined crystalline dimensions and said at least one interlayer is formed with a texture matched to the crystalline dimensions of said superconductor material.

8. The structure according to claim 7, wherein said at least one interlayer is made from an oxide selected from the group consisting of biaxially textured, yttrium-stabilized $ZrO_2$ and $CeO_2$.

9. The structure according to claim 1, wherein said conductor track is a plurality of discrete conductor tracks and said support is a common support for said plurality of conductor tracks.

10. A current limiter device, comprising at least one superconductor structure according to claim 1.

11. The current limiter device according to claim 10, which comprises a plurality of electrically interconnected modular current limiter elements each having a superconductor structure according to claim 1.

12. The current limiter device according to claim 11, wherein each said current limiter element has a winding comprising a bifilar-wound conductor strip having the superconductor structure.

13. The current limiter device according to claim 12, which comprises insulating strips between said strip conductor windings, said insulating strips being disposed to enable access a coolant between adjacent conductor strip layers.

14. A superconductor structure for conducting an electric current in a predetermined direction, comprising:
   a support of metallic material;
   a conductor track on said support, said conductor track containing at least one interlayer of electrically insulating material deposited on said support and at least one superconducting layer of high-$T_c$ superconductor material deposited on said interlayer, said interlayer having with lateral recesses formed therein in which said superconducting layer rests on said support;
   at least one electrically conductive connecting part extending in a current flow direction of said conductor track and electrically connecting said superconducting layer in parallel with said support.

* * * * *